United States Patent
Zhang et al.

(10) Patent No.: US 11,495,673 B2
(45) Date of Patent: Nov. 8, 2022

(54) VERTICAL FIN FIELD EFFECT TRANSISTOR WITH A REDUCED GATE-TO-BOTTOM SOURCE/DRAIN PARASITIC CAPACITANCE

(71) Applicant: INTERNATIONAL BUSINESS MACHINES CORPORATION, Armonk, NY (US)

(72) Inventors: Chen Zhang, Albany, NY (US); Kangguo Cheng, Schenectady, NY (US); Xin Miao, Guilderland, NY (US); Wenyu Xu, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 423 days.

(21) Appl. No.: 16/685,067

(22) Filed: Nov. 15, 2019

(65) Prior Publication Data

US 2020/0091316 A1 Mar. 19, 2020

Related U.S. Application Data

(62) Division of application No. 15/850,723, filed on Dec. 21, 2017, now Pat. No. 10,566,444.

(51) Int. Cl.
*H01L 29/66* (2006.01)
*H01L 29/78* (2006.01)
(Continued)

(52) U.S. Cl.
CPC ............... *H01L 29/66553* (2013.01); *H01L 21/823431* (2013.01); *H01L 29/0653* (2013.01);
(Continued)

(58) Field of Classification Search
CPC ............... H01L 29/785; H01L 29/7827; H01L 29/66719
See application file for complete search history.

(56) References Cited

U.S. PATENT DOCUMENTS 5,087,581 A 2/1992 Rodder
5,250,450 A 10/1993 Lee et al.
(Continued)

OTHER PUBLICATIONS

Kunz et al., "Reduction of Parasitic Capacitance in Vertical MOSFETs by Spacer Local Oxidation," IEEE Transactions on Election Devices. vol. 50. No. 6. Jun. 2003. pp. 1487-1493.
List of IBM Patents or Patent Applications Treated as Related dated Nov. 15, 2019, 2 pages.

*Primary Examiner* — Changhyun Yi
(74) *Attorney, Agent, or Firm* — Tutunjian & Bitetto, P.C.; Randall Bluestone

(57) ABSTRACT

A method of forming a vertical fin field effect device is provided. The method includes, forming a vertical fin on a substrate, forming a masking block on the vertical fin, wherein the masking block extends a distance outward from the vertical fin sidewalls and endwalls, and a portion of the substrate surrounding the masking block is exposed. The method further includes removing at least a portion of the exposed portion of the substrate to form a recess and a fin mesa below the vertical fin, removing a portion of the fin mesa to form an undercut recess below an overhanging portion of the masking block, forming a spacer layer on the masking block and in the undercut recess, and removing a portion of the spacer layer to form an undercut spacer in the undercut recess.

18 Claims, 10 Drawing Sheets

(51) Int. Cl.
*H01L 29/10* (2006.01)
*H01L 21/8234* (2006.01)
*H01L 29/06* (2006.01)
*H01L 29/786* (2006.01)
*H01L 29/423* (2006.01)

(52) U.S. Cl.
CPC .... *H01L 29/1033* (2013.01); *H01L 29/42392* (2013.01); *H01L 29/6656* (2013.01); *H01L 29/66666* (2013.01); *H01L 29/66719* (2013.01); *H01L 29/66742* (2013.01); *H01L 29/66795* (2013.01); *H01L 29/785* (2013.01); *H01L 29/78642* (2013.01); *H01L 29/78654* (2013.01); *H01L 29/78681* (2013.01); *H01L 29/78684* (2013.01)

(56) References Cited

U.S. PATENT DOCUMENTS

| | | |
|---|---|---|
| 6,770,534 B2 | 8/2004 | Cho et al. |
| 7,683,428 B2 | 3/2010 | Chidambarrao et al. |
| 8,629,512 B2 | 1/2014 | Liaw |
| 9,287,362 B1 | 3/2016 | Basu et al. |
| 9,337,306 B2 | 5/2016 | Peng et al. |
| 9,368,572 B1 | 6/2016 | Cheng et al. |
| 9,437,503 B1 | 9/2016 | Mallela et al. |
| 9,472,572 B2 | 10/2016 | Zang |
| 9,716,170 B1 | 7/2017 | Cheng et al. |
| 2006/0261406 A1 | 11/2006 | Chen |
| 2012/0299099 A1* | 11/2012 | Huang ............... H01L 29/785 257/E21.294 |
| 2017/0373166 A1 | 12/2017 | Bergendahl et al. |

\* cited by examiner

VERTICAL FIN FIELD EFFECT TRANSISTOR WITH A REDUCED GATE-TO-BOTTOM SOURCE/DRAIN PARASITIC CAPACITANCE

BACKGROUND

Technical Field

The present invention generally relates to compensating for the exposure of bottom source/drain regions resulting from the formation of isolation regions, and more particularly to forming a dielectric spacer on the sidewalls of the bottom source/drain regions to insulate the bottom source/drain regions from conductive components of a gate structure.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a method of forming a vertical fin field effect device is provided. The method includes forming a vertical fin on a substrate. The method further includes forming a masking block on the vertical fin, wherein the masking block extends a distance outward from the vertical fin sidewalls and endwalls, and a portion of the substrate surrounding the masking block is exposed. The method further includes removing at least a portion of the exposed portion of the substrate to form a recess and a fin mesa below the vertical fin. The method further includes removing a portion of the fin mesa to form an undercut recess below an overhanging portion of the masking block. The method further includes forming a spacer layer on the masking block and in the undercut recess and removing a portion of the spacer layer to form an undercut spacer in the undercut recess.

In accordance with another embodiment of the present invention, a method of forming a pair of vertical fin field effect devices is provided. The method includes forming two vertical fins on a substrate. The method further includes forming a masking block on each of the two vertical fins, wherein the masking block extends a distance outward from the sidewalls and endwalls of each vertical fin, wherein a portion of the substrate surrounding each of the two masking blocks and between the two masking blocks is exposed. The method further includes removing the exposed portion of the substrate to form a recess surrounding each of the masking blocks, and a fin mesa below each of the vertical fins. The method further includes removing a portion of each of the fin mesas to form an undercut recess below an overhanging portion of each of the masking blocks. The method further includes forming a spacer layer on each of the masking blocks and in each of the undercut recess, and removing the spacer layer on the masking blocks to form an undercut spacer in each of the undercut recess.

In accordance with yet another embodiment of the present invention, a vertical fin field effect device is provided. The vertical fin field effect device includes a fin mesa on a substrate, and a vertical fin on the fin mesa. The vertical fin field effect device further includes an undercut spacer surrounding the fin mesa, and an isolation plug surrounding the undercut spacer, wherein the height of the isolation plug is less than the height of the undercut spacer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to separating a bottom source/drain region from a gate structure by forming a dielectric spacer on the sidewalls between the bottom source/drain region and the adjacent isolation region. Trenches formed for isolation regions can involve over-etching to ensure the top surface of the bottom source/drain region is fully revealed. The over-etching can create an exposed sidewall along the bottom source/drain region, which can remain exposed after formation of a bottom spacer. The exposed sidewall can be in contact with a subsequently formed gate dielectric layer and adjoining conductive gate layers, which can add parasitic capacitances depending on the extend of over-etching and side of exposed sidewall.

Embodiments of the present invention relate generally to forming a source/drain tier (also referred to as a fin mesa) from the substrate material, and forming a conformal dielectric spacer layer on the sidewalls of the source/drain tier before forming the bottom spacer and gate structure. The dielectric spacer can increase the distance and dielectric constant between the gate structure and bottom source/drain region.

Exemplary applications/uses to which the present invention can be applied include, but are not limited to: logic and memory devices utilizing vertical fin field effect transistors.

It is to be understood that aspects of the present invention will be described in terms of a given illustrative architecture; however, other architectures, structures, substrate materials and process features and steps can be varied within the scope of the aspects of the present invention.

Figure 1:
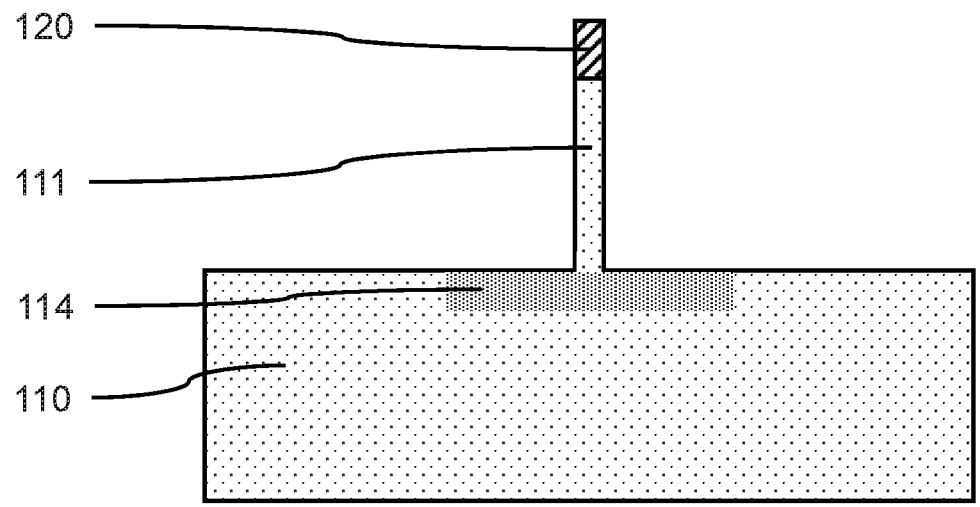
FIG. 1 is a cross-sectional side view showing a vertical fin on a substrate, a fin template on the vertical fin, and a bottom source/drain region below the vertical fin, in accordance with an embodiment of the present invention.

Referring now to the drawings in which like numerals represent the same or similar elements and initially to FIG. 1, a cross-sectional side view of a vertical fin on a substrate, a fin template on the vertical fin, and a bottom source/drain region below the vertical fin, in accordance with an embodiment of the present invention.

In one or more embodiments, a plurality of vertical fins 111 can be formed on a substrate 110, wherein the vertical fins extend away from an exposed surface of the substrate. The vertical fins 111 and substrate 110 can be formed from a semiconductor material, where the vertical fins can be the same material as the substrate or a different semiconductor material from the substrate. The vertical fins can be etched or grown.

A substrate 110 can be, for example, a single crystal semiconductor material wafer or a semiconductor-on-insulator stacked wafer. The substrate can include a support layer that provides structural support, and an active semiconductor layer that can form devices. An insulating layer may be between the active semiconductor layer and the support layer to form a semiconductor-on-insulator substrate (SeOI) (e.g., a silicon-on-insulator substrate (SOI)).

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g. silica, borosilicate glass), ceramic (e.g., aluminum oxide ($Al_2O_3$, sapphire), plastic (e.g., polycarbonate, polyacetonitrile), metal (e.g. aluminum, gold, titanium, molybdenum-copper (MoCu) composites, etc.), or combination thereof.

The active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)).

The insulating layer can be, for example, a buried oxide (BOX) layer (e.g., $SiO_2$) or an implanted layer forming a buried insulating material.

In one or more embodiments, one or more vertical fin(s) 111 can be formed on the substrate 110, where the vertical fins can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins may be formed by a direct write process or double patterning process using, for example, immersion lithography, extreme ultraviolet lithography, or x-ray lithography.

In various embodiments, the vertical fin(s) 111 can have a width in the range of about 4 nm to about 12 nm, or about 5 nm to about 10 nm, or about 6 nm to about 8 nm, although other widths are also contemplated.

In various embodiments, a fin template 120 may be on each vertical fin 111, where the fin template 120 can be formed during the patterning process. The fin templates 120 can be a hardmask, for example, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. A thin (i.e., <1 nm) oxide layer can be between the top surface of the vertical fin 111 and the fin template 120.

In one or more embodiments, a bottom source/drain region 114 can be formed in the substrate 110, where the bottom source/drain region 114 can be below the vertical fin 111. In various embodiments, the substrate 110 can be ex-situ doped, where doping occurs before and/or after forming the vertical fin 111. Dopants (n-type or p-type) can be incorporated by suitable doping techniques, including but not limited to, ion implantation, gas phase doping, plasma doping, plasma immersion ion implantation, cluster doping, infusion doping, liquid phase doping, solid phase doping, etc. In various embodiments, the bottom source/drain region 114 is doped to form n-type or p-type source/drains to fabricate NFETs or PFETs. In various embodiments, in-situ phosphorus doped silicon can be used as the bottom source/drain for NFETs and in-situ boron doped silicon germanium can be used as the bottom source/drain for PFETs. The dopant concentration can be sufficient to form a source/drain for a FinFET.

Figure 2:
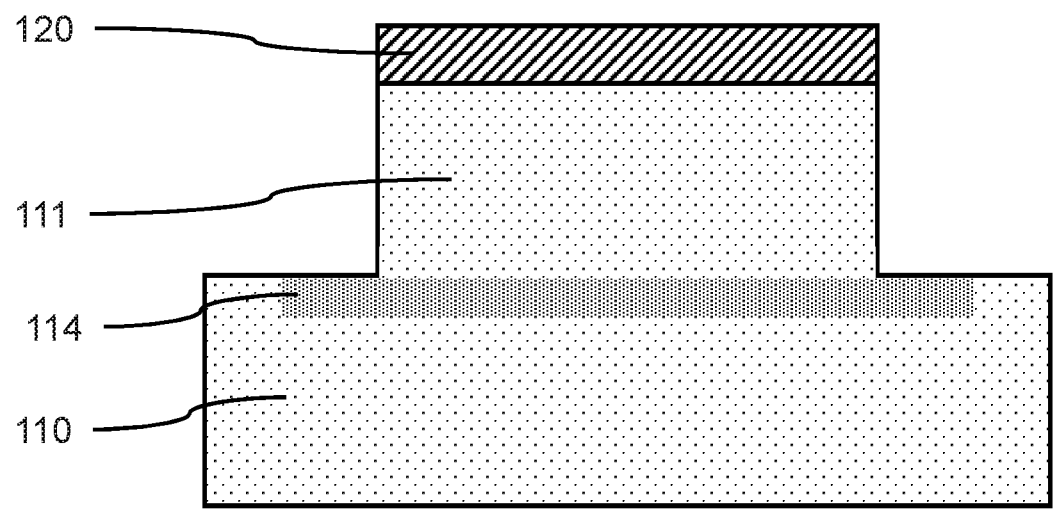
FIG. 2 is a cross-sectional side view showing a long axis of the vertical fin and fin template, in accordance with an embodiment of the present invention.

FIG. 2 is a cross-sectional side view showing a long axis of the vertical fin and fin template, in accordance with an embodiment of the present invention.

In one or more embodiments, the vertical fins can have a height in the range of about 15 nm to about 100 nm, or about 15 nm to about 50 nm, or about 50 nm to about 100 nm, or about 30 nm to about 70 nm, although other heights are contemplated.

In one or more embodiments, the vertical fins can have a length in the range of about 20 nm to about 200 nm, or in the range of about 20 nm to about 100 nm, or in the range of about 20 nm to about 80 nm, although other lengths are contemplated.

Figure 3:
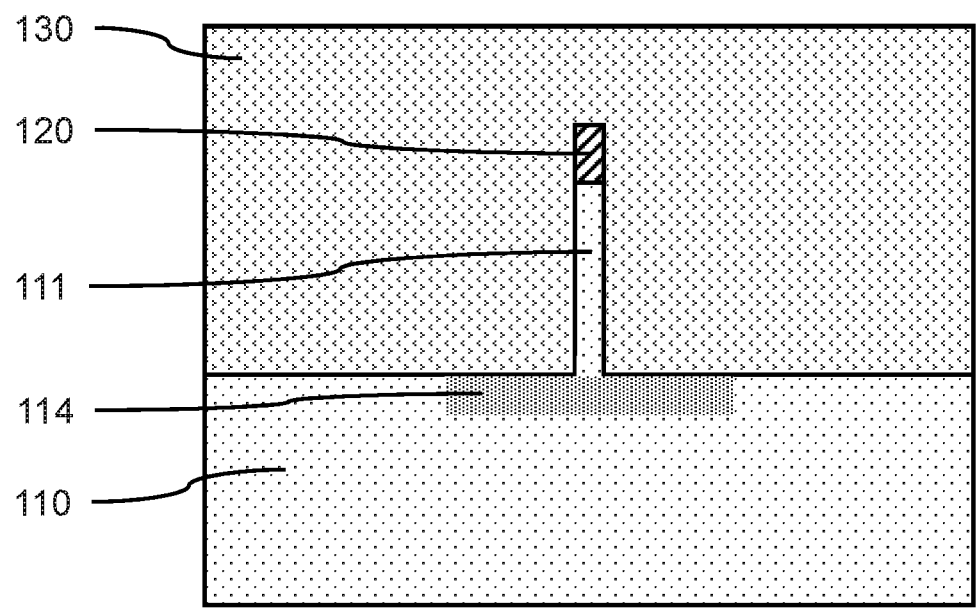
FIG. 3 is a cross-sectional side view showing a masking layer on the vertical fin and fin template, in accordance with an embodiment of the present invention.

FIG. 3 is a cross-sectional side view showing a masking layer on the vertical fin and fin template, in accordance with an embodiment of the present invention.

In one or more embodiments, a masking layer 130 can be formed on the exposed substrate surface, vertical fin 111, and fin template 120, where the masking layer 130 can be formed by a blanket deposition, for example, chemical vapor deposition (CVD), plasma enhanced CVD (PECVD), or a spin-on process. The masking layer 130 can extend above the top surface of the fin templates 120, and a chemical-mechanical polishing (CMP) used to reduce the height and provide a planarized surface.

In various embodiments, the masking layer 130 can be a soft mask material, for example, a lithography resist material, such as a polymeric material (e.g. poly(methyl methacrylate) (PMMA), siloxanes, polydimethylsiloxane (PDMS), hydrogen silsesquioxane (HSQ), tetraethyl orthosilicate (TEOS), etc.) or amorphous carbon (a-C).

In various embodiments, the masking layer 130 can be a hard mask comprising a dielectric material such as silicon nitride (SiN), silicon dioxide (SiO), a silicon oxynitride (SiON), a silicon carbide (SiC), a silicon oxygen carbonitride (SiOCN), or a silicoboron carbonitride (SiBCN). The masking layer 130 can also be a multi-layer of a softmask and hardmask material.

Figure 4:
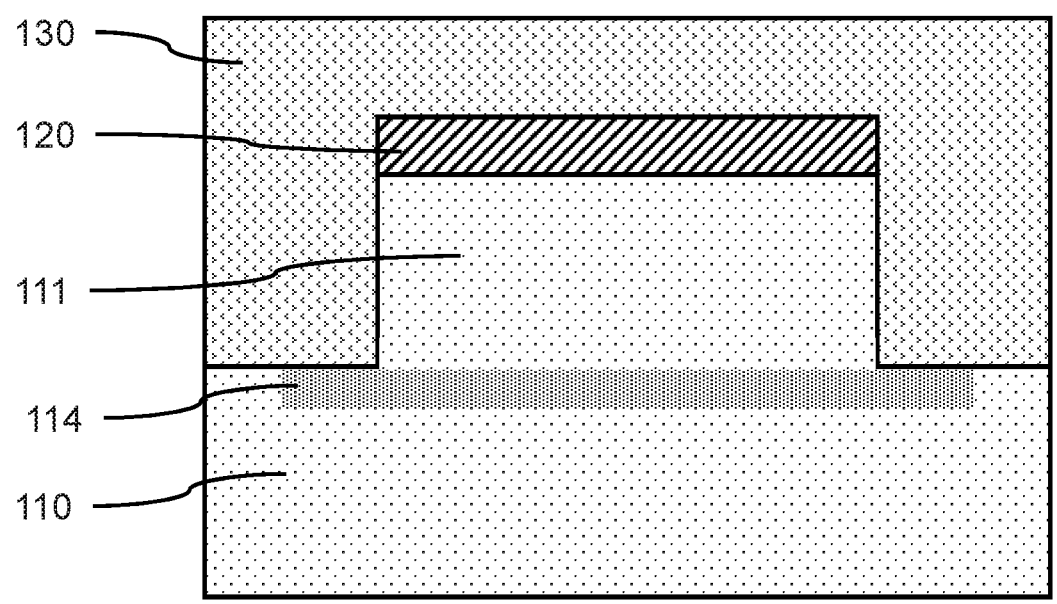
FIG. 4 is a cross-sectional side view showing the long axis of the vertical fin covered by the masking layer, in accordance with an embodiment of the present invention.

FIG. 4 is a cross-sectional side view showing the long axis of the vertical fin covered by the masking layer, in accordance with an embodiment of the present invention.

In one or more embodiments, the masking layer 130 can surround the vertical fin 111 and fin template 120, where the masking layer can cover the surrounding substrate 110 and bottom source/drain region 114.

Figure 5:
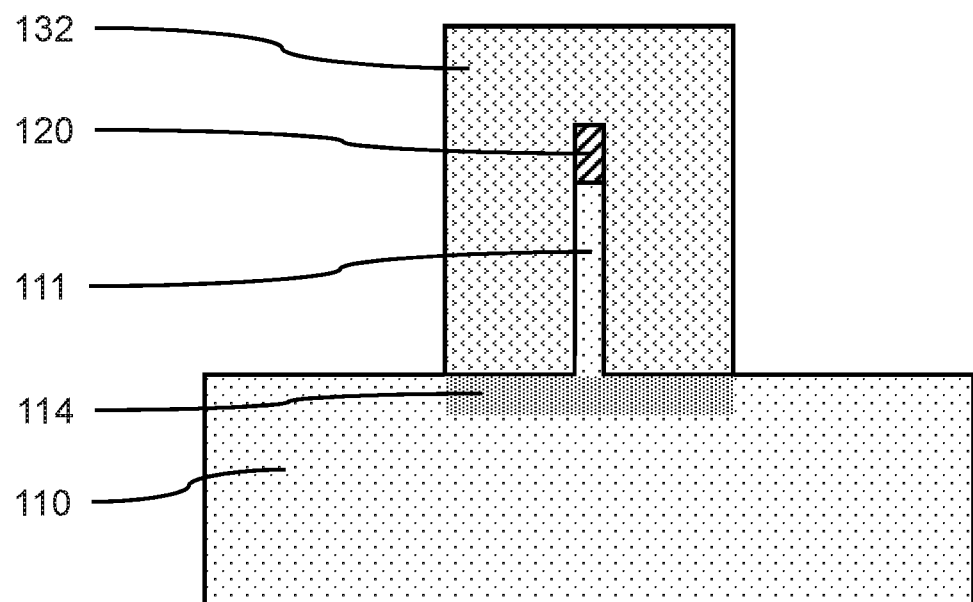
FIG. 5 is a cross-sectional side view showing a patterned masking block on the vertical fin and fin template, in accordance with an embodiment of the present invention.

FIG. 5 is a cross-sectional side view showing a patterned masking block on the vertical fin and fin template, in accordance with an embodiment of the present invention.

In one or more embodiments, the masking layer 130 can be patterned and etched to form a masking block 132 on one or more vertical fin(s) 111 and fin template(s) 120, where the masking block 132 extends a distance outward from the sidewalls and endwalls of the vertical fin(s) 111, and covers the adjacent portion of the substrate surface. In various embodiments, the masking block 132 can be patterned and etched to extend the same distance from both vertical fin sidewalls and/or endwalls, so the cross section is symmetric. In other embodiments, the masking block 132 can be patterned and etched to extend different distances from each of the vertical fin sidewalls and endwalls, so the cross sections would be asymmetric. The masking block 132 can surround the one or more vertical fins 111 and leave an exposed portion of the substrate surface surrounding the vertical fins beyond the masking block 132.

In various embodiments, the masking block 132 can extend a distance from a sidewall in the range of about 6 nm to about 12 nm, or in the range of about 8 nm to about 10 nm, or about 8 nm, although other distances are contemplated. The distance the masking block extends to either side of the vertical fin can be at least the same as the fin width.

Figure 6:
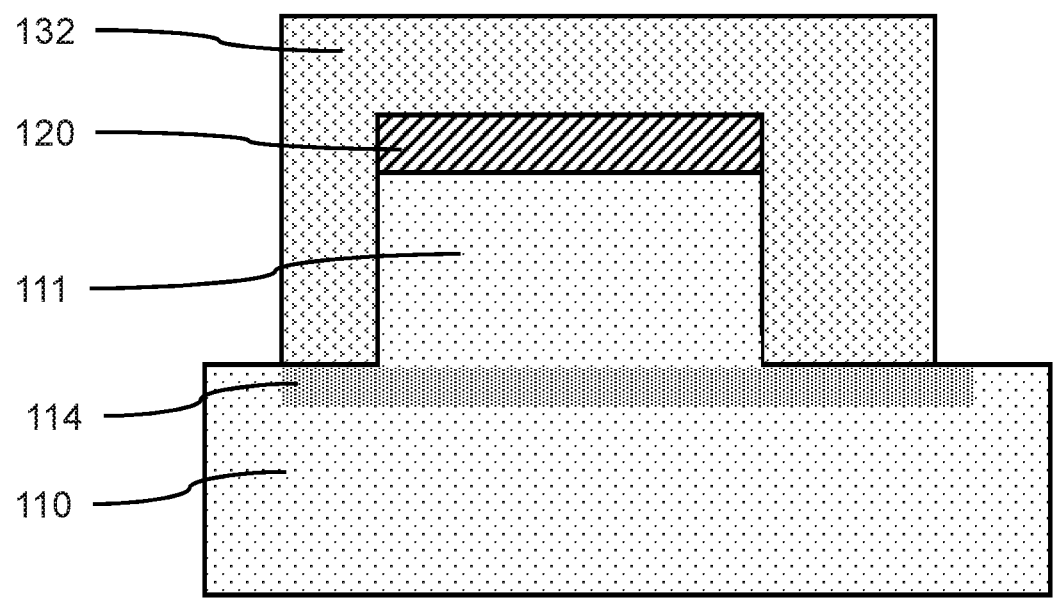
FIG. 6 is a cross-sectional side view showing the long axis of the vertical fin covered by the masking block, in accordance with an embodiment of the present invention.

FIG. 6 is a cross-sectional side view showing the long axis of the vertical fin covered by the masking block, in accordance with an embodiment of the present invention.

In various embodiments, the masking block 132 can be patterned and etched to extend different distances from each of the vertical fin sidewalls, so the cross section would be asymmetric. The masking block 132 can extend a greater distance on one side of the vertical fin endwall to create a larger ledge for contact with a subsequently formed electrical contact to a bottom source/drain region. In various embodiments, the masking block 132 can extend a distance from an endwall in the range of about 6 nm to about 12 nm, or in the range of about 8 nm to about 10 nm, or about 8 nm, on one side of the vertical fin 111, and a distance in the range of about 12 nm to about 36 nm, or in the range of about 16 nm to about 24 nm, or about 20 nm, on the opposite side of the vertical fin 111. The additional space can allow formation of an electrical contact.

In various embodiments, the masking block 132 can be patterned and etched to extend the same distance from both vertical fin sidewalls, so the cross section is symmetric. In various embodiments, the masking block 132 can extend a distance in the range of about 12 nm to about 36 nm, or in the range of about 16 nm to about 24 nm, or about 20 nm, on both sides of the vertical fin 111. The bottom source/drain region 114 may extend beyond the edges of the masking block 132.

Figure 7:
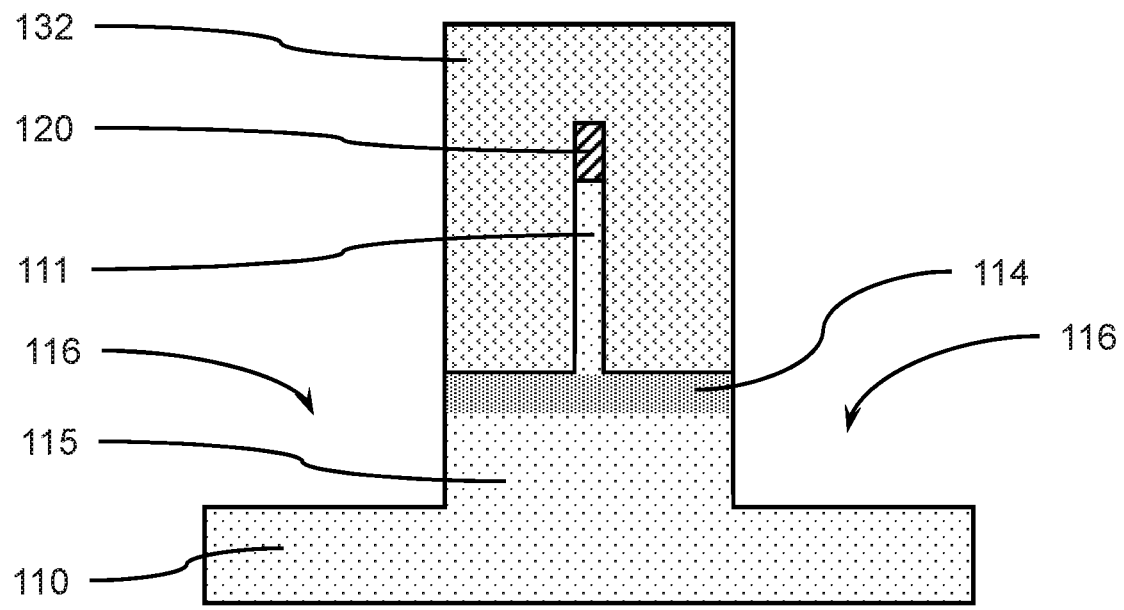
FIG. 7 is a cross-sectional side view showing a recess formed in the substrate and a fin mesa formed below the vertical fin, in accordance with an embodiment of the present invention.

FIG. 7 is a cross-sectional side view showing a recess formed in the substrate and a fin mesa formed below the vertical fin, in accordance with an embodiment of the present invention.

In one or more embodiments, a recess 116 can be formed in the substrate 110 around one or more vertical fins 111, and a fin mesa 115 formed below the one or more vertical fins. The recess 116 can be formed by an isotropic wet chemical etch, a directional etch (e.g., reactive ion etch (RIE)), or a combination of a wet chemical etch followed by a directional etch (e.g., reactive ion etch (RIE)) to achieve straight sidewalls of the fin mesa 115, where the exposed portion of the substrate 110 can be removed to a predetermined depth. The formation of the recess 116 can remove portions of the bottom source/drain region 114 that extended past the area covered by the masking block 132. The recess 116 can extend a distance into the substrate greater than the depth of the bottom source/drain region 114, such that a sidewall of the bottom source/drain region can become exposed by formation of the recess 116.

In various embodiments, the recess 116 can extend to a depth in the range of about 20 nm to about 60 nm, or in the range of about 30 nm to about 50 nm, although other depths are also contemplated. The bottom source/drain region 114 can have a depth below the vertical fin 111 less than the depth of the recess 116, for example, the bottom source/drain region 114 can extend a depth of about 15 nm to about 40 nm or about 20 nm to about 30 nm into the fin mesa 115 from the top surface.

Figure 8:
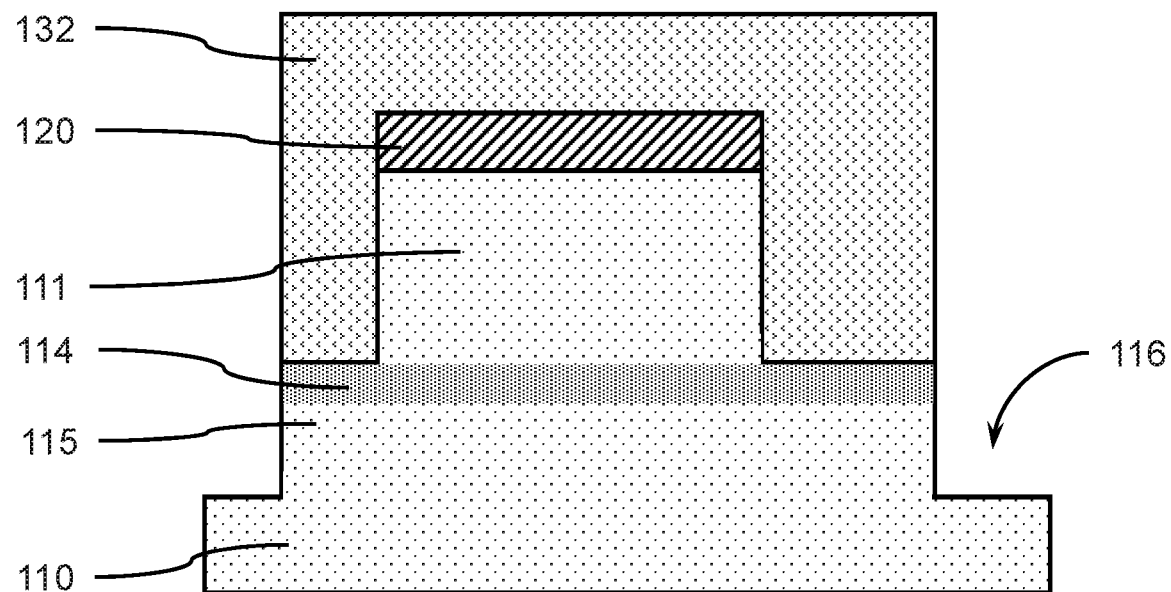
FIG. 8 is a cross-sectional side view showing the long axis of the vertical fin and masking block with the recess and ledge formed by the fin mesa around the vertical fin, in accordance with an embodiment of the present invention.

FIG. 8 is a cross-sectional side view showing the long axis of the vertical fin and masking block with the recess and ledge formed by the fin mesa around the vertical fin, in accordance with an embodiment of the present invention.

In one or more embodiments, the recess 116 surrounds the one or more vertical fins 111, where the recess 116 can separate a first set of vertical fins intended to form a vertical fin field effect transistor (FinFET) from other fins intended to form other devices, including other FinFETs. The recess 116 can be used to form isolation regions, including shallow trench isolation (STI) regions, where the isolation regions can electrically separate neighboring bottom source/drain regions 114.

Figure 9:
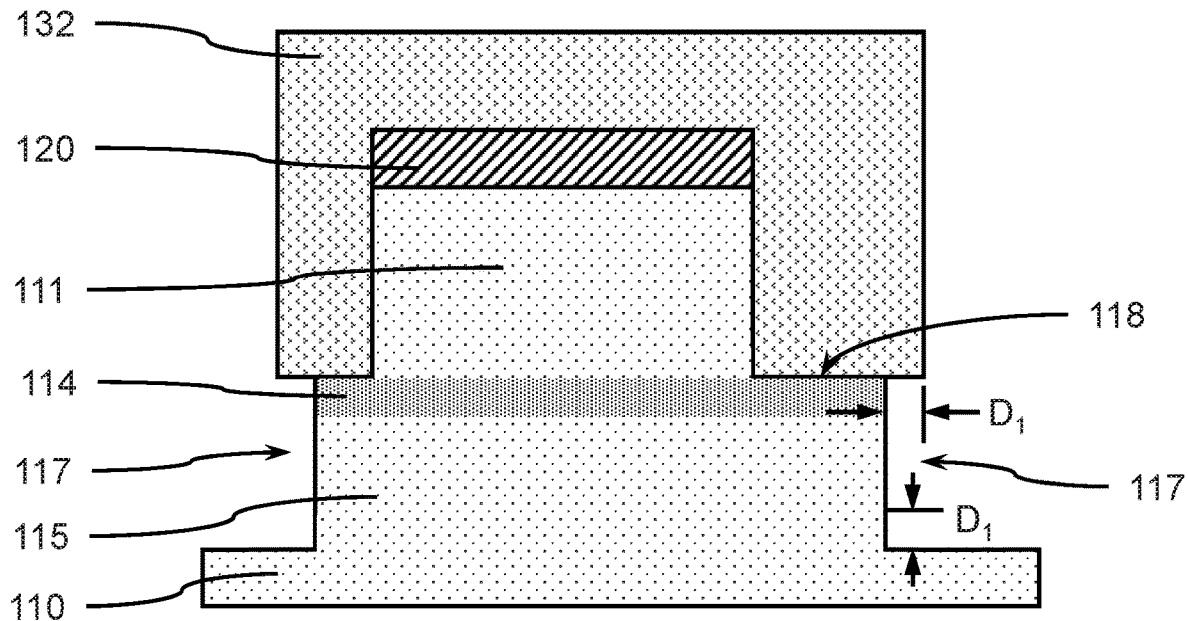
FIG. 9 is a cross-sectional side view showing the long axis of the vertical fin with an undercut recess of the fin mesa with an overhanging masking block, in accordance with an embodiment of the present invention.

FIG. 9 is a cross-sectional side view showing the long axis of the vertical fin with an undercut recess of the fin mesa with an overhanging masking block, in accordance with an embodiment of the present invention.

In one or more embodiments, a portion of the sidewalls and endwalls of the fin mesa 115, including a portion of the bottom source/drain region 114, can be removed to form an undercut recess 117 below an overhanging portion of the masking block 132. A selective isotropic etch, for example, a wet chemical etch or dry plasma etch, can be used to remove an exposed portion of the fin mesa 115 below the masking block 132, where the selective isotropic etch etches laterally into the fin mesa and bottom source/drain region 114. The lateral etch can reduce the size of the ledge 118 next to the vertical fin.

In one or more embodiments, the undercut recess 117 can have a depth, $D_1$, in the range of about 3 nm to about 15 nm, or in the range of about 4 nm to about 10 nm, or in the range of about 5 nm to about 7 nm, although other depths are also contemplated. In various embodiments, the undercut recess 117 may not have a depth, $D_1$, of less than 4 nm. The distance the masking block 132 extends from the fin(s) and resulting ledge 118 can be increased to compensate for the depth, $D_1$, of the undercut recess 117.

The height of the substrate 110 can be further reduced by the isotropic etch of the fin mesa sidewalls and endwalls, where the height of the substrate 110 can be reduced by the same distance as the depth, $D_1$, of the undercut recess 117. In various embodiments, a protective etch-stop layer may not be formed on the exposed substrate surface before formation of the undercut recess 117. The depth of the recess 116 can be increased by the depth, $D_1$, of the undercut recess 117.

Figure 10:
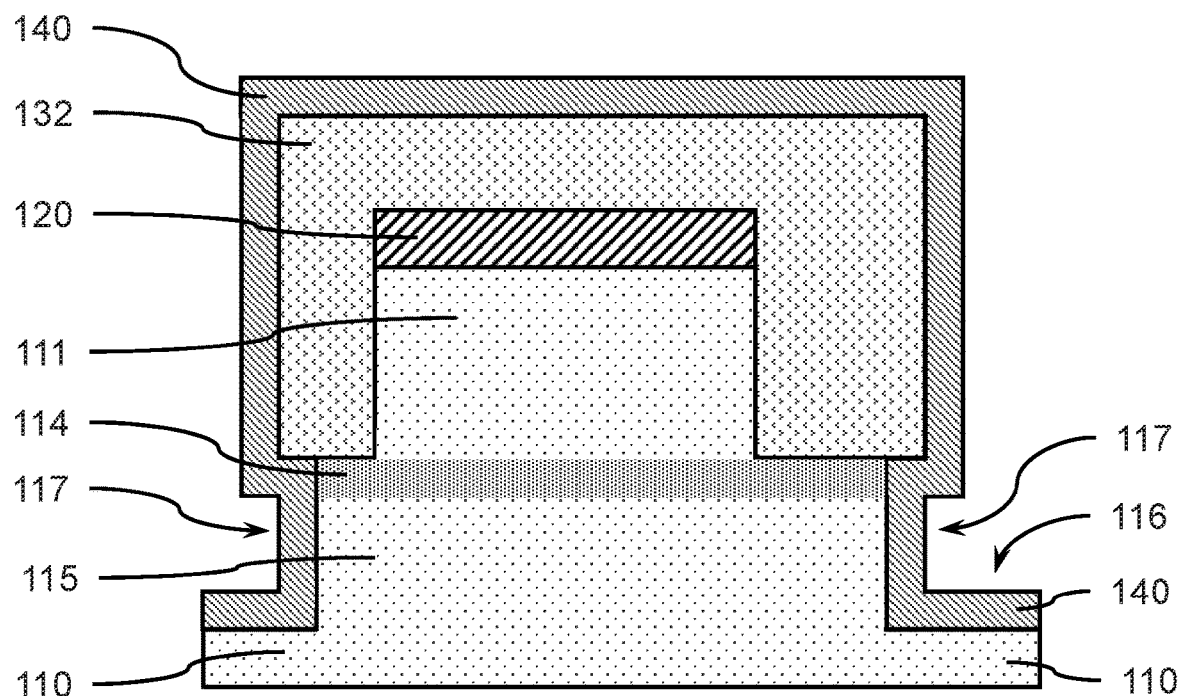
FIG. 10 is a cross-sectional side view showing the long axis of the vertical fin with a spacer layer formed on the exterior surface of the masking block and substrate, and in the undercut recess, in accordance with an embodiment of the present invention.

FIG. 10 is a cross-sectional side view showing the long axis of the vertical fin with a spacer layer formed on the exterior surface of the masking block and substrate, and in the undercut recess, in accordance with an embodiment of the present invention.

In one or more embodiments, a spacer layer 140 can be formed on the exterior surface of the masking block 132, fin mesa 115, bottom source/drain region 114, and exposed surface of the substrate 110, where the spacer layer 140 can be formed by a conformal deposition (e.g., atomic layer deposition (ALD), plasma enhanced ALD (PEALD), chemical vapor deposition (CVD), plasma enhanced CVD (PECVD)). In various embodiments, the spacer layer 140 can fill in the undercut recess 117.

In various embodiments, the spacer layer 140 can be a dielectric material, including, but not limited to, silicon nitride (SiN), a silicon oxynitride (SiON), a silicon carbonitride (SiCN), a silicon boronitride (SiBN), a silicon borocarbide (SiBC), a silicon boro carbonitride (SiBCN), or combinations thereof, where the spacer layer 140 can be selectively etched relative to the masking block 132 and substrate 110 materials. In various embodiments, the spacer layer 140 is not silicon oxide (SiO).

In various embodiments, the spacer layer 140 can have a thickness in the range of about 3 nm to about 15 nm, or in the range of about 4 nm to about 10 nm, or in the range of about 5 nm to about 7 nm, where the thickness of the spacer layer 140 can be sufficient to fill in the undercut recess 117.

Figure 11:
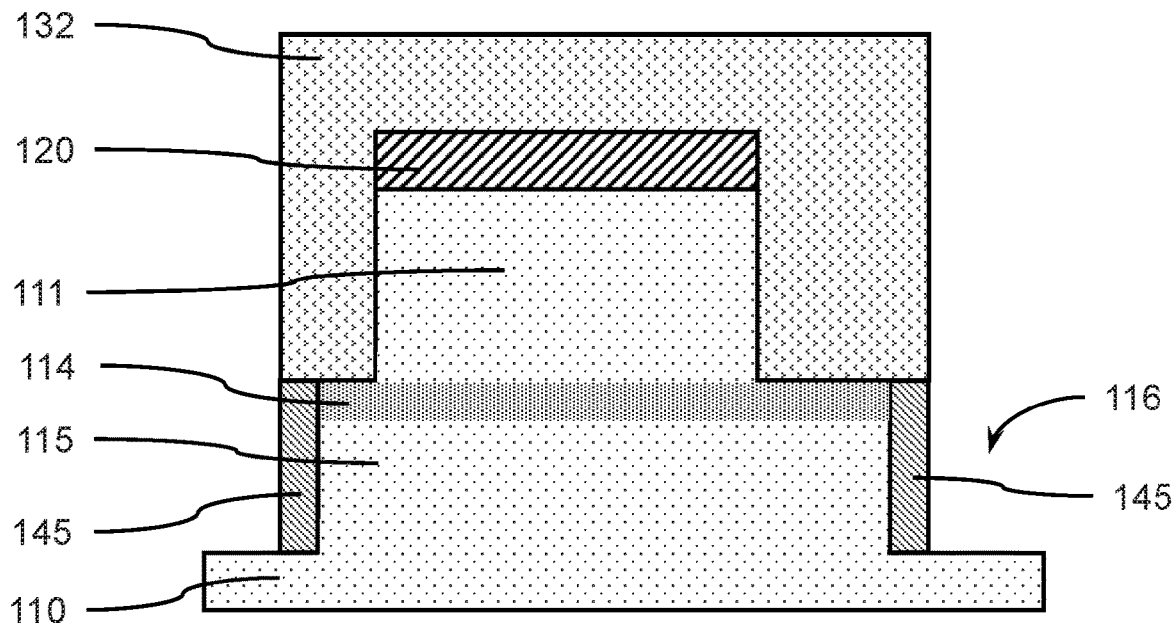
FIG. 11 is a cross-sectional side view showing the long axis of the vertical fin with an undercut spacer formed in the undercut recess after removing portions of the spacer layer, in accordance with an embodiment of the present invention.

FIG. 11 is a cross-sectional side view showing the long axis of the vertical fin with an undercut spacer formed in the undercut recess after removing portions of the spacer layer, in accordance with an embodiment of the present invention.

In one or more embodiments, a portion of the spacer layer 140 not in the undercut recess 117 can be removed, where a directional etch (e.g., RIE) can be used to remove the portions of the spacer layer 140 on the sidewalls of the masking block 132 and the exposed top surfaces of the masking block and substrate 110. The remaining portion of the spacer layer can form an undercut spacer 145 in the undercut recess 117, where the undercut spacer 145 can be overhung by a portion of the masking block 132. The undercut spacer 145 and the undercut recess 117 can wrap around the sidewalls and endwalls of the fin mesa 115, such that the undercut spacer 145 surrounds the fin mesa.

In various embodiments, a protective layer can be formed on the horizontal surfaces of the spacer layer 140, where the protective layer can be a selectively etchable dielectric material that can act as an etch stop layer. The protective layer can have a height greater than the depth of the recess 116, so the portion of the spacer layer 140 in the undercut recess 117 is covered. A wet chemical etch (i.e., isotropic wet etch) can be used to remove the exposed portions of the spacer layer 140 on the sidewalls of the masking block 132. The protecting layer can then be removed, and a directional etch (e.g., RIE) can be used to remove the portions of the spacer layer 140 on the horizontal surfaces leaving the undercut spacer 145 overhung by a portion of the masking block. The undercut spacer 145 can cover the sidewalls of the fin mesa 115 and bottom source/drain region 114, where the undercut spacer can reduce the parasitic capacitance from having the bottom source/drain region 114 partially exposed.

Figure 12:
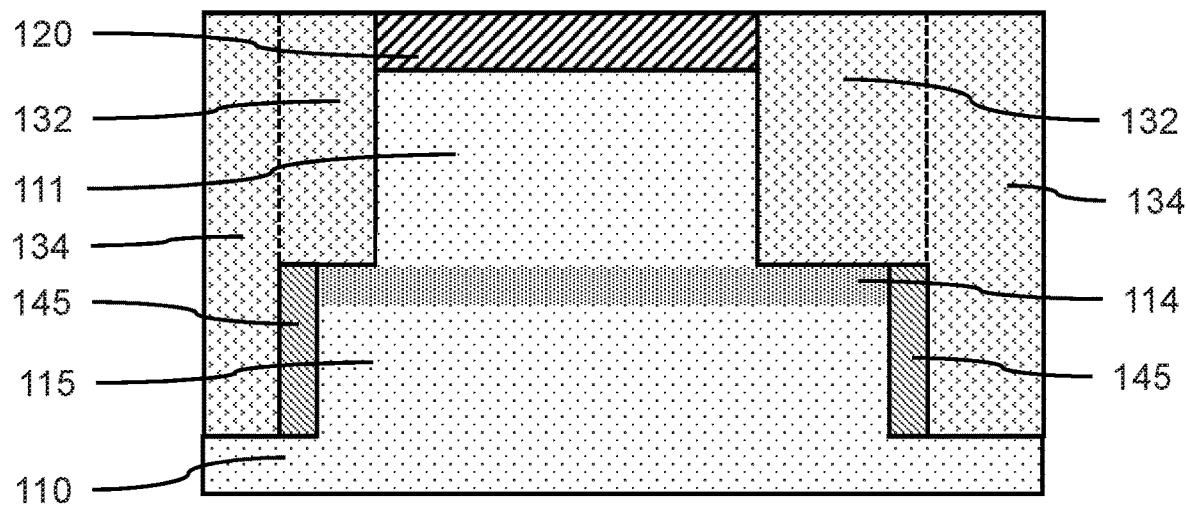
FIG. 12 is a cross-sectional side view showing the long axis of the vertical fin with a fill layer formed in the recess, in accordance with an embodiment of the present invention.

FIG. 12 is a cross-sectional side view showing the long axis of the vertical fin with a fill layer formed in the recess, in accordance with an embodiment of the present invention.

In one or more embodiments, a fill layer 134 can be formed in the recess 116 and on the masking block 132, where the fill layer 134 can be selected from the same materials as the masking block, and can be the same material as the masking block. The fill layer 134 can extend above the top surface of the masking block 132, and a chemical-mechanical polishing (CMP) used to reduce the height of the fill layer 134 and masking block 132 to provide a planarized surface exposing the fin template 120.

Figure 13:
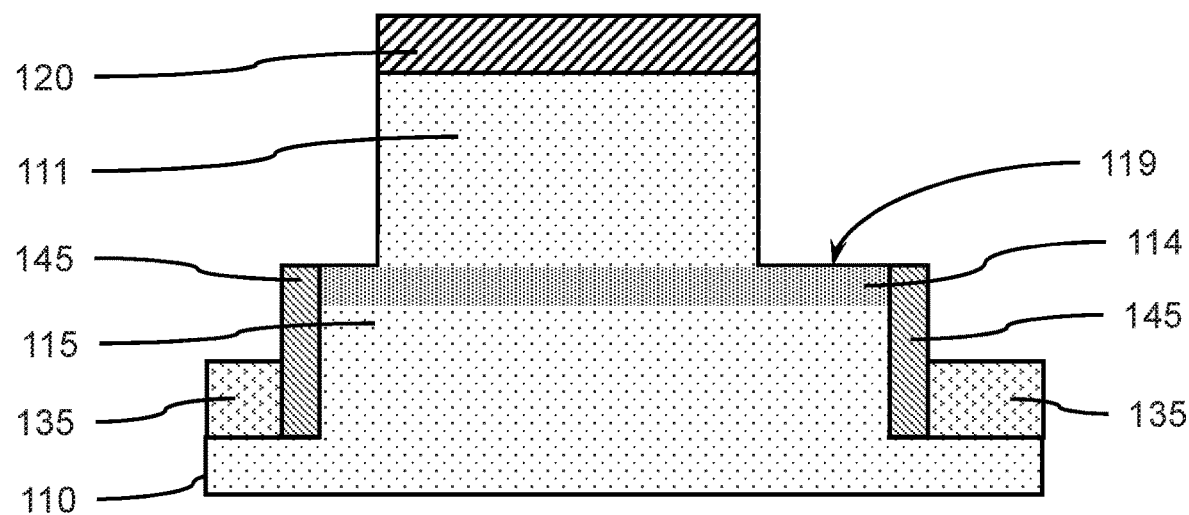
FIG. 13 is a cross-sectional side view showing the long axis of the vertical fin with the height of the masking block and fill layer reduced to form an isolation plug and expose a top surface of the fin mesa and undercut spacer, in accordance with an embodiment of the present invention.

FIG. 13 is a cross-sectional side view showing the long axis of the vertical fin with the height of the masking block and fill layer reduced to form an isolation plug and expose a top surface of the fin mesa and undercut spacer, in accordance with an embodiment of the present invention.

In one or more embodiments, the masking block 132 can be removed and the height of the fill layer 134 can be reduced to form an isolation plug 135 that exposes a top surface 119 of the fin mesa 115 and undercut spacer 145. The masking block 132 can be removed and the height of the fill layer 134 can be reduced using a directional etch (e.g., RIE) or an isotropic etch (e.g., wet chemical etch). The height of the masking block 132 and fill layer 134 can be reduced below the top surface 119 of the fin mesa 115 and undercut spacer 145 to form the isolation plug 135. An upper portion of the undercut spacer 145 can be exposed by formation of the isolation plug 135. The top surface of the undercut spacer 145 can be flush with the top surface 119 of the fin mesa 115, and cover a portion of the sidewall of the fin mesa 115 and/or bottom source/drain region 114 that would otherwise become exposed by the over-etch of fill layer 134.

In various embodiments, the isolation plug 135 can have a height from the substrate surface in a range of about 20 nm to about 100 nm, or in a range of about 30 nm to about 60 nm, whereas the undercut spacer 145 an have a height from the substrate surface in a range of about 23 nm to about 75 nm, or in a range of about 33 nm to about 65 nm, or in a range of about 45 nm to about 53 nm. In various embodiments, the height of the isolation plug 135 is less than the height of the undercut spacer 145, where the top surface of the isolation plug 135 can be below the top surface of the undercut spacer 145 by a distance in a range of about 1 nm to about 10 nm, or about 3 nm to about 8 nm. The difference in height between the isolation plug 135 and undercut spacer 145 can be due to the over-etch of the fill layer 134.

Figure 14:
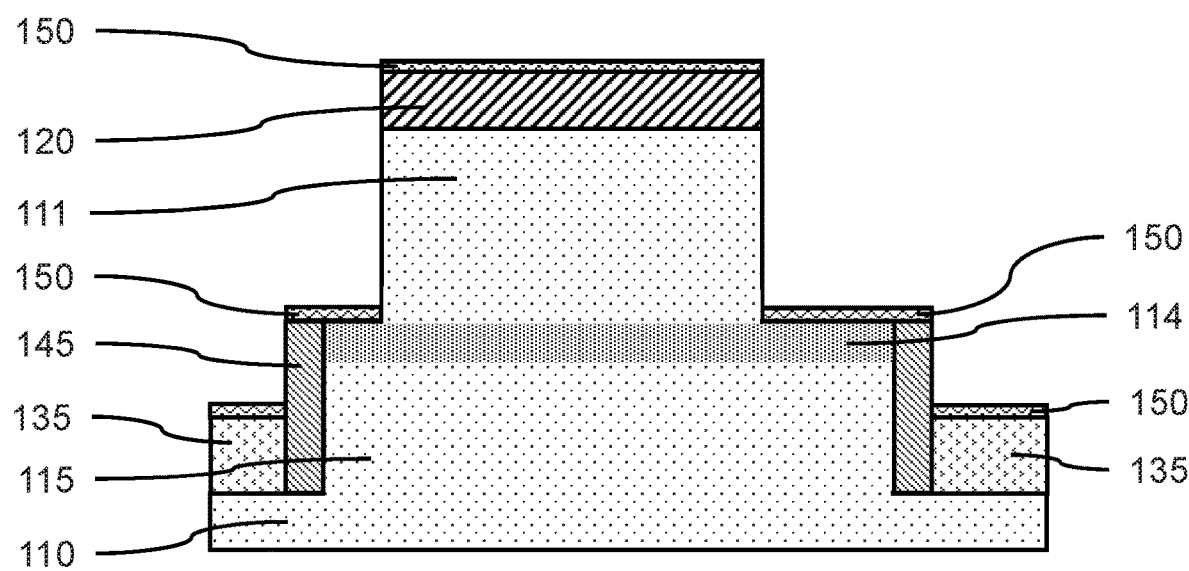
FIG. 14 is a cross-sectional side view showing the long axis of the vertical fin with a bottom spacer formed on the fin template, top surface of the fin mesa, undercut spacer, and isolation plug, in accordance with an embodiment of the present invention.

FIG. 14 is a cross-sectional side view showing the long axis of the vertical fin with a bottom spacer formed on the fin template, top surface of the fin mesa, undercut spacer, and isolation plug, in accordance with an embodiment of the present invention.

In one or more embodiments, a bottom spacer 150 can be formed on the fin template 120, exposed top surface 119 of the fin mesa 115 and undercut spacer 145, and on the exposed top surface of the isolation plug 135, where the bottom spacer 150 can be formed by a directional deposition (e.g., high density plasma CVD (HDPCVD), gas cluster ion beam (GCIB), or a combination thereof. The top surfaces of the undercut spacer 145 and fin mesa 115 can be essentially coplanar, where the bottom spacer 150 can be formed across the fin mesa 115 and undercut spacer 145 without an interruption for the thickness of the bottom spacer. The bottom spacer 150 can cover an exposed surface of the bottom source/drain region 114.

In various embodiments, the material of the bottom spacer 150 can be a dielectric material including, but not be limited to, silicon oxide (SiO), silicon nitride (SiN), a silicon oxynitride (SiON), a silicon carbonitride (SiCN), a silicon boronitride (SiBN), a silicon borocarbide (SiBC), a low-K dielectric, or combinations thereof. A low-K dielectric can include amorphous carbon (a-C), fluorine doped silicon oxide (SiO:F), carbon doped silicon oxide (SiO:C), SiCOH, silicon boro carbonitride (SiBCN), or a combination thereof. Other examples include, Applied Material's Black Diamond™.

In various embodiments, the bottom spacer 150 can have a thickness in the range of about 3 nm to about 15 nm, or in the range of about 5 nm to about 10 nm, or about 3 nm to about 5 nm, although other thicknesses are contemplated.

Figure 15:
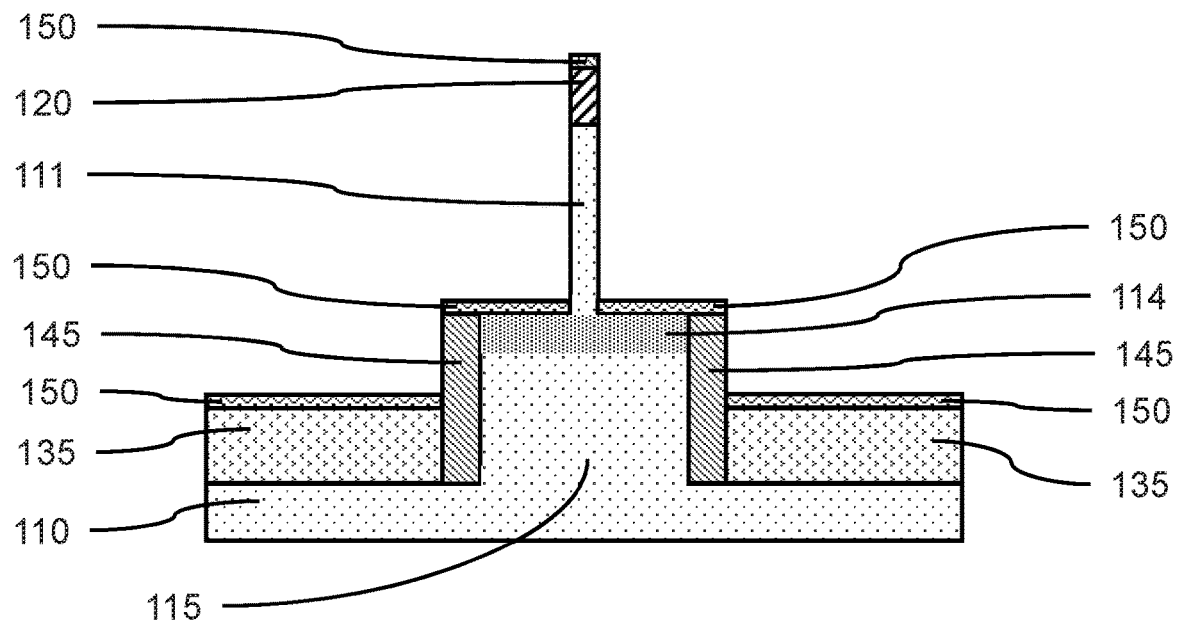
FIG. 15 is a cross-sectional side view showing a bottom spacer on the top surfaces of the fin template, fin mesa, undercut spacer, bottom source/drain region, and isolation plug, in accordance with an embodiment of the present invention.

FIG. 15 is a cross-sectional side view showing a bottom spacer on the top surfaces of the fin template, fin mesa, undercut spacer, bottom source/drain region, and isolation plug, in accordance with an embodiment of the present invention.

In one or more embodiments, the bottom spacer 150 formed on the top surfaces of the bottom source/drain region 114, fin mesa 115, and undercut spacer 145 can surround the vertical fin 111, and the bottom spacer 150 on the isolation plug 135 can surround the fin mesa 115 and form part of an isolation region. The bottom spacer 150 can cover the bottom source/drain region 114 adjacent to the vertical fin 111.

Figure 16:
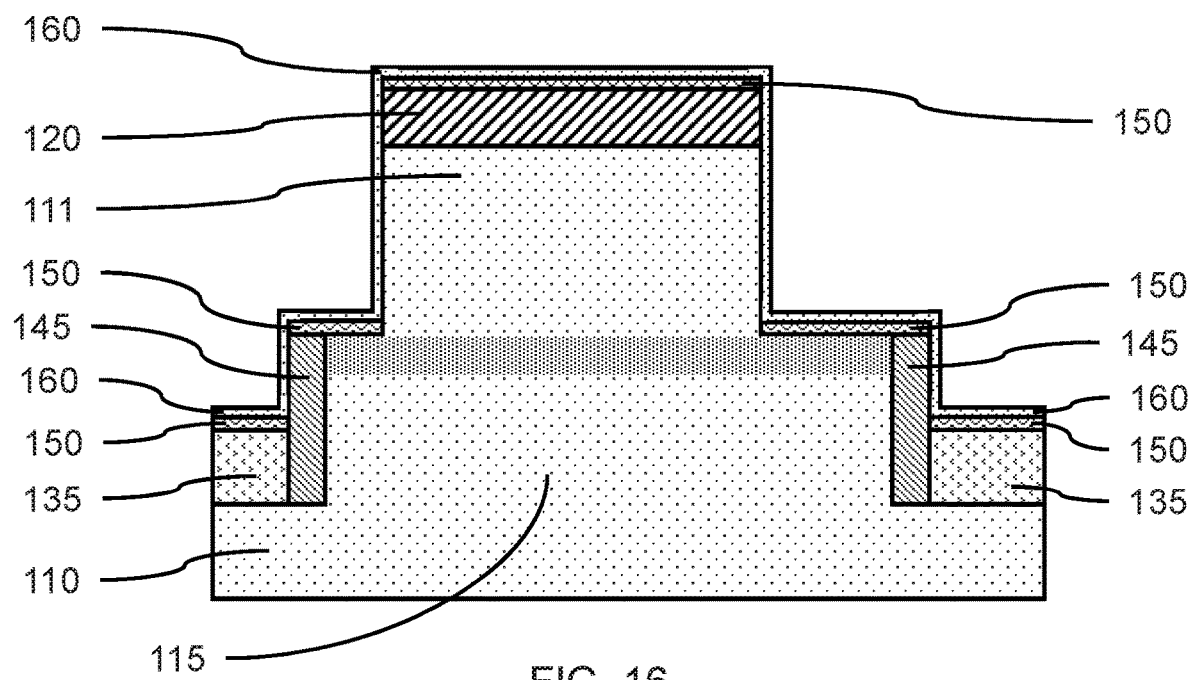
FIG. 16 is a cross-sectional side view showing the long axis of the vertical fin with a gate dielectric layer on the bottom spacer, sidewalls of the undercut spacer, and endwalls of the vertical fin, in accordance with an embodiment of the present invention.

FIG. 16 is a cross-sectional side view showing the long axis of the vertical fin with a gate dielectric layer on the bottom spacer, sidewalls of the undercut spacer, and endwalls of the vertical fin, in accordance with an embodiment of the present invention.

In one or more embodiments, a gate dielectric layer 160 can be formed on the bottom spacer 150, sidewalls of the undercut spacer 145, and sidewalls and endwalls of the vertical fin 111, where the gate dielectric layer 160 can be formed by a conformal deposition (e.g., ALD, PEALD, CVD, PECVD).

In one or more embodiments, a gate dielectric layer 160 can be silicon oxide (SiO), silicon nitride (SiN), silicon oxynitride (SiON), boron nitride (BN), high-k dielectric materials, or a combination thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 160 can have a thickness in the range of about 7 Å to about 30 Å, or about 7 Å to about 10 Å, or about 1 nm to about 2 nm.

Figure 17:
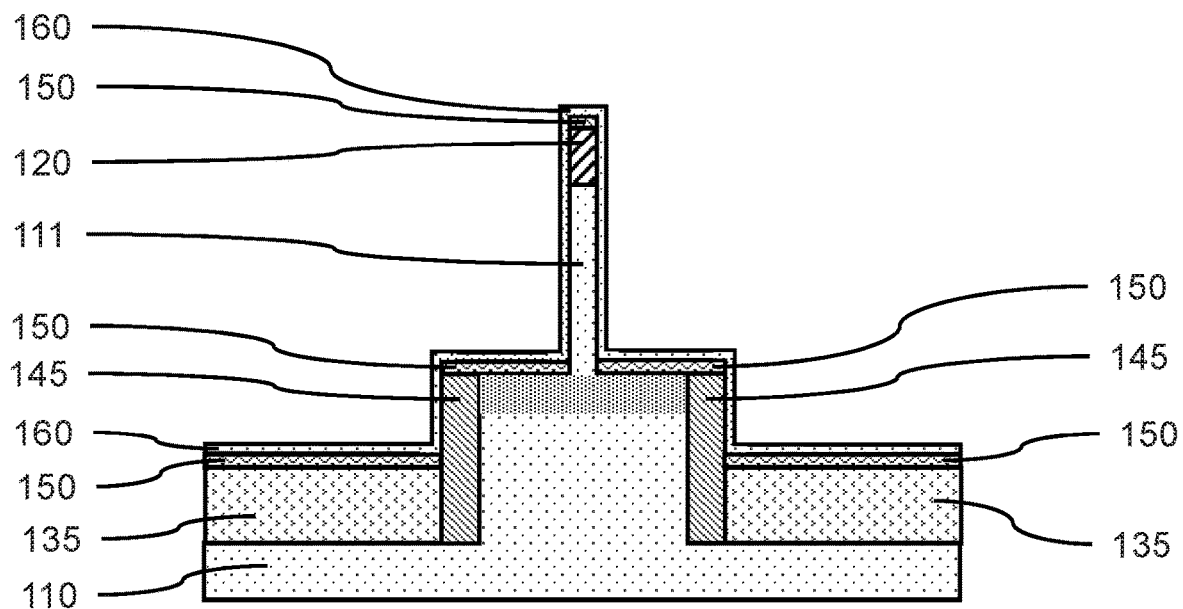
FIG. 17 is a cross-sectional side view showing a gate dielectric layer on the bottom spacer, sidewalls of the undercut spacer, and sidewalls of the vertical fin, in accordance with an embodiment of the present invention.

FIG. 17 is a cross-sectional side view showing a gate dielectric layer on the bottom spacer, sidewalls of the undercut spacer, and sidewalls of the vertical fin, in accordance with an embodiment of the present invention.

In one or more embodiments, a gate dielectric layer 160 can be formed on the sidewalls of the vertical fin 111, where the gate dielectric layer 160 can surround the vertical fin.

Figure 18:
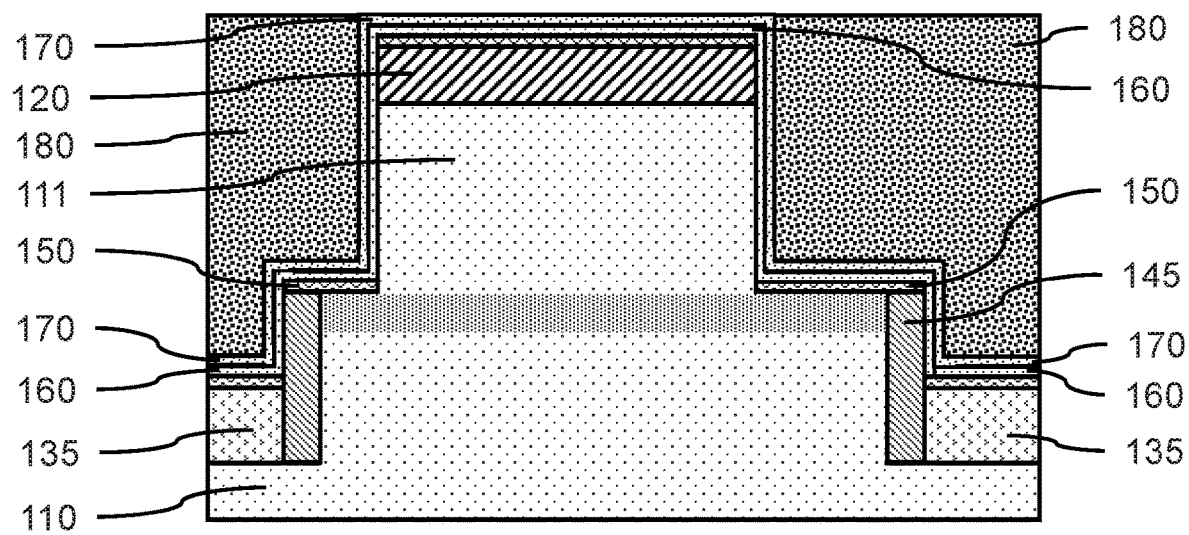
FIG. 18 is a cross-sectional side view showing the long axis of the vertical fin with a work function layer and conductive gate fill on the gate dielectric layer to form a gate structure, in accordance with an embodiment of the present invention.

FIG. 18 is a cross-sectional side view showing the long axis of the vertical fin with a work function layer and conductive gate fill on the gate dielectric layer to form a gate structure, in accordance with an embodiment of the present invention.

In one or more embodiments, a work function layer 170 and conductive gate fill 180 can be formed on the gate dielectric layer 160 to form a gate structure, where the work function layer 170 can be formed by a conformal deposition. The work function layer 170 can be formed on a portion of the gate dielectric layer 160 to form a gate structure for a fin field effect transistor (FinFET).

In various embodiments, the work function layer 170 can include, but not necessarily be limited to, titanium nitride (TiN), tantalum nitride (TaN) or ruthenium (Ru), for a PFET. The work function layer 170 can include, but not necessarily be limited to, titanium nitride (TiN), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN, for an NFET.

The work function layer 170 can have a thickness in the range of about 2 nm to about 10 nm, or about 3 nm to about 6 nm.

In one or more embodiments, a conductive gate fill 180 can be formed on at least a portion of the work function layer 1970 or gate dielectric layer 160 if the work function layer is not present. The conductive gate fill 180 can be formed by a blanket deposition, and a CMP can be used to remove excess material.

In various embodiments, the conductive gate fill 180 can include, but not necessarily be limited to, amorphous silicon (a-Si), or metals, for example, tungsten (W), cobalt (Co), zirconium (Zr), tantalum (Ta), titanium (Ti), aluminum (Al), ruthenium (Ru), copper (Cu), metal carbides (e.g., TaC, TiC, WC, etc.), metal nitrides (e.g., TaN, ZrN, etc.), transition metal aluminides (e.g., TiAl, CoAl, NiAl, etc.), tantalum magnesium carbide, or combinations thereof. The conductive gate fill 180 can be deposited on the work function layer 170, or the gate dielectric layer 160 if a work function layer is not present, to form the gate structure. In various embodiments, the undercut spacers 145 can be between at least a portion of the conductive gate fill 180 and/or the work function layer 170 and the bottom source/drain region 114, where the undercut spacers 145 can physically separate and electrically isolate the gate structure from the bottom source/drain region 114 to reduce the parasitic capacitance.

Figure 19:
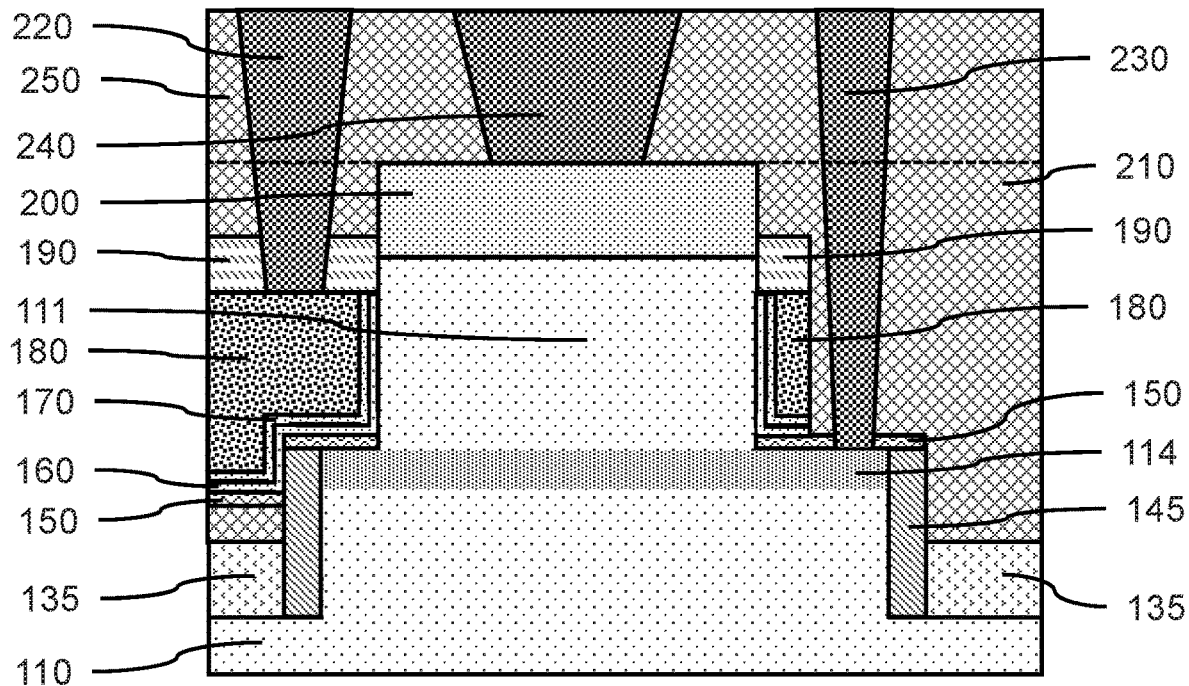
FIG. 19 is a cross-sectional side view showing the long axis of the vertical fin with a top source/drain on the vertical fin, and electrical contacts to the gate structure, top source/drain, and bottom source/drain region, in accordance with an embodiment of the present invention.

FIG. 19 is a cross-sectional side view showing the long axis of the vertical fin with a top source/drain on the vertical fin, and electrical contacts to the gate structure, top source/drain, and bottom source/drain region, in accordance with an embodiment of the present invention.

In one or more embodiments, the height of the conductive gate fill 180 can be reduced using, for example, a directional etch (e.g., reactive ion etch (RIE)). The exposed portion of the work function layer 170 can be removed using a selective etch, and the exposed portion of the gate dielectric layer 160 can be removed using a selective etch to expose an upper portion of the vertical fins 111.

In one or more embodiments, a top spacer layer 190 can be formed on the conductive gate fill 180, work function layer 170, and gate dielectric layer 160. In various embodiments, the top spacer layer 190 can be formed by a directional deposition, for example, a high density plasma CVD (HDPCVD) or gas cluster ion beam (GCIB). The top spacer layer 190 can cover an exposed upper portion of the vertical fins 111, where the top surface of the top spacer layer 190 can be at, above, or below the top surface of the vertical fins 111.

In various embodiments, the material of the top spacer layer 190 can be a dielectric material, including, but not limited to, silicon oxide (SiO), silicon nitride (SiN), a silicon oxynitride (SiON), a silicon carbonitride (SiCN), a silicon boronitride (SiBN), a silicon borocarbide (SiBC), a low-K dielectric, or combinations thereof.

In various embodiments, an interlayer dielectric (ILD) layer 210 can be formed on the top spacer layer 190, vertical fin 111, gate structure, and in openings to form isolation regions between devices. The ILD layer 210 can be a dielectric material including, but not limited to, silicon oxide (SiO), silicon nitride (SiN), a silicon oxynitride (SiON), a silicon carbonitride (SiCN), a silicon boronitride (SiBN), a silicon borocarbide (SiBC), a low-K dielectric, or combinations thereof.

In various embodiments, the ILD layer 210 can be planarized using a CMP to expose the fin template 120. The fin template 120 can be removed using a selective etch to expose the top surface of the vertical fin 111, and a top source/drain 200 can be formed on the top surface of the vertical fin. The top source/drain 200 can be formed by epitaxial growth on the exposed surface of the vertical fin.

In various embodiments, a cover layer 250 can be formed on an ILD layer 210, top source/drain 200, and the gate structures. The cover layer 250 can be selected from the same materials as the ILD layer 210, and can be the same material as the ILD layer. Trenches and vias can be formed in the cover layer 250 and ILD layer 210 to form electrical contacts to the tops source/drain 200, bottom source/drain region 114, and conductive gate fill 180 of the gate structures.

In one or more embodiments, an electrical gate contact 220 can be formed to the conductive gate fill 180. A top source/drain contact 240 can be formed to the top source/drain 200. A bottom source/drain contact 230 can be formed to a bottom source/drain region 114. The electrical gate contact 220, bottom source/drain contact 230, and top source/drain contact 240 can be a conductive material, for example, tungsten (W), tantalum (Ta), tantalum nitride (TaN), cobalt (Co), ruthenium (Ru), or combinations thereof. These top source/drain contact 240 and bottom source/drain contact 230 can be deposited in blanket form (covering all exposed surfaces) that can fill in trenches and vias, and then be polished, using for example, chemical mechanical polishing (CMP).

Figure 20:
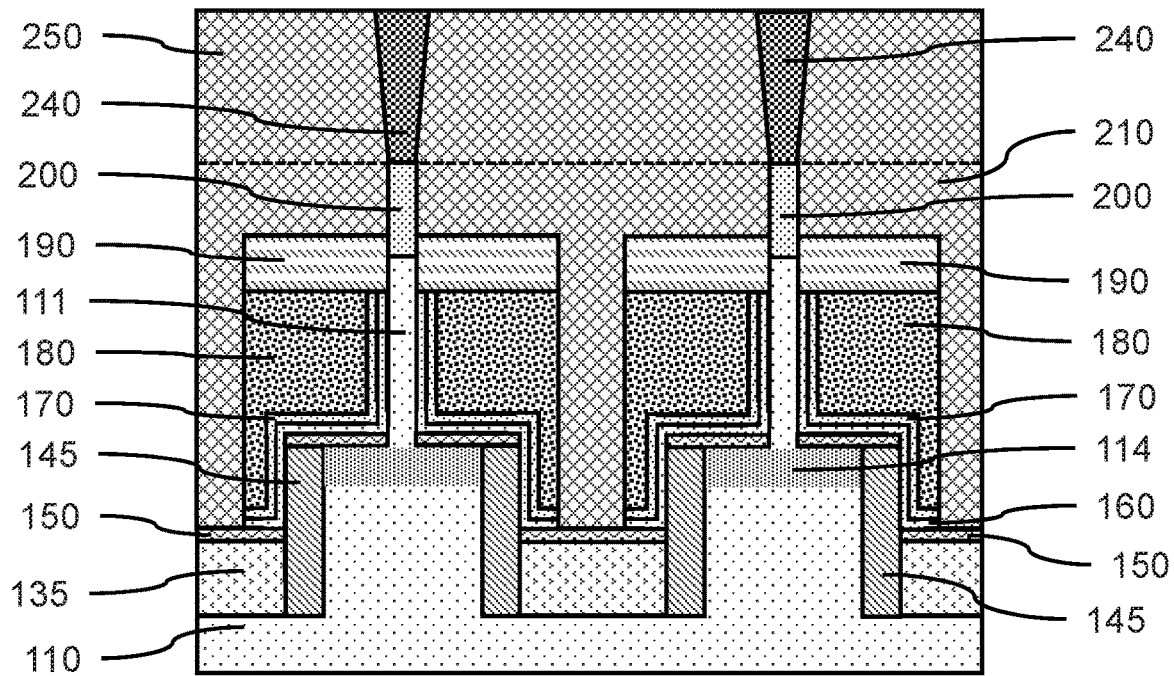
FIG. 20 is a cross-sectional side view showing an adjacent pair of vertical fins with gate structures and top spacer layers, an ILD layer on the gate structures, a cover layer on the ILD layer, and an electrical contact to each of the top source/drains, in accordance with an embodiment of the present invention.

FIG. 20 is a cross-sectional side view showing an adjacent pair of vertical fins with gate structures and top spacer layers, an ILD layer on the gate structures, a cover layer on the ILD layer, and an electrical contact to each of the top source/drains, in accordance with an embodiment of the present invention.

In one or more embodiments, an adjacent pair of vertical fins 111 with gate structures and top spacer layers 190 can be formed, where the adjacent pair of vertical fins 111 can be separated by a fin pitch in the range of about 30 nm to about 100 nm, or in the range of about 40 nm to about 75 nm, or in the range of about 40 nm to about 50 nm, although other fin pitches are also contemplated. The undercut spacers 145 on the two adjacent devices can be separated by a distance in the range of about 6 nm to about 20 nm, or in the range of about 8 nm to about 15 nm, or in the range of about 8 nm to about 10 nm, although other distances are also contemplated. The thickness of the undercut spacers 145 can be adjusted to allow sufficient spacer for forming the isolation plugs 135 between the two devices for the predetermined fin pitch.

In various embodiments, the undercut spacers 145 can avoid an increase in parasitic capacitance of about 10% to about 25% due to the over-etch forming the isolation plugs 135 depending on the length of fin mesa 115 sidewall and bottom source/drain region 114 that would otherwise have been exposed, where the gate structure and bottom source/drain region 114 would have been separated by only the gate dielectric layer 160.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein. the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A vertical fin field effect device, comprising:
   a fin mesa on a substrate;
   a vertical fin on a top surface of the fin mesa;
   a bottom source/drain region in the fin mesa beneath the vertical fin;
   an undercut spacer surrounding the fin mesa, wherein the undercut spacer has a height; and
   an isolation plug surrounding the undercut spacer, wherein a height of the isolation plug is less than the height of the undercut spacer.

2. The vertical fin field effect device of claim 1, wherein the fin mesa extends a distance in a range of about 6 nm to about 12 nm from a first vertical fin endwall, and a distance in a range of about 12 nm to about 36 nm from a second vertical fin endwall opposite the first vertical fin endwall.

3. The vertical fin field effect device of claim 2, wherein the undercut spacer has a thickness in a range of about 3 nm to about 15 nm.

4. The vertical fin field effect device of claim 2, further comprising a bottom spacer on the top surface of the fin mesa and the undercut spacer, and on a top surface of the isolation plug.

5. The vertical fin field effect device of claim 4, further comprising a gate dielectric layer on the bottom spacer, sidewalls of the undercut spacer, and sidewalls and endwalls of the vertical fin.

6. The vertical fin field effect device of claim 5, further comprising a work function layer and a conductive gate fill on the gate dielectric layer to form a gate structure.

7. The vertical fin field effect device of claim 1, wherein the fin mesa extends a greater distance from a first vertical fin endwall than a distance from a second vertical fin endwall opposite the first vertical fin endwall.

8. The vertical fin field effect device of claim 7, further comprising a bottom source/drain contact in physical contact with a portion of the bottom source/drain region extending a greater distance from the second vertical fin endwall.

9. A vertical fin field effect device, comprising:
   a fin mesa on a substrate;
   a vertical fin on a top surface of the fin mesa, wherein the fin mesa extends a greater distance from a first vertical fin endwall than a distance from a second vertical fin endwall opposite the first vertical fin endwall;
   a bottom source/drain region in the fin mesa beneath the vertical fin;
   an undercut spacer surrounding the fin mesa, wherein the undercut spacer has a height;
   an isolation plug surrounding the undercut spacer, wherein a height of the isolation plug is less than the height of the undercut spacer; and
   a bottom spacer on the top surface of the fin mesa and the undercut spacer, and on a top surface of the isolation plug.

10. The vertical fin field effect device of claim 9, further comprising a gate dielectric layer on the bottom spacer, sidewalls of the undercut spacer, and sidewalls and endwalls of the vertical fin.

11. The vertical fin field effect device of claim 10, further comprising a work function layer and a conductive gate fill on the gate dielectric layer to form a gate structure.

12. The vertical fin field effect device of claim 11, further comprising a top spacer layer on the conductive gate fill, work function layer, and gate dielectric layer.

13. The vertical fin field effect device of claim 12, further comprising a bottom source/drain contact in physical contact with a portion of the bottom source/drain region extending a greater distance from the second vertical fin endwall.

14. A pair of vertical fin field effect devices, comprising:
   a first fin mesa on a substrate;
   a second fin mesa on the substrate adjacent to the first fin mesa;
   a first vertical fin on a top surface of the first fin mesa, wherein the first fin mesa extends a greater distance from a first vertical fin endwall than a distance from a second vertical fin endwall opposite the first vertical fin endwall of the first vertical fin;
   a second vertical fin on a top surface of the second fin mesa, wherein the second fin mesa extends a greater distance from a first vertical fin endwall than a distance from a second vertical fin endwall opposite the first vertical fin endwall of the second vertical fin;
   a first undercut spacer surrounding the first fin mesa, wherein the first undercut spacer has a first height;
   a second undercut spacer surrounding the second fin mesa, wherein the second undercut spacer has a second height, and wherein the first undercut spacer is separated from the second undercut spacer by a distance in a range of about 6 nm to about 20 nm;
   a first isolation plug surrounding the first undercut spacer and the second undercut spacer, wherein a height of the isolation plug is less than the height of the first undercut spacer.

15. The vertical fin field effect device of claim 14, further comprising a bottom spacer on the top surface of the first fin mesa and the first undercut spacer, and on a top surface of the isolation plug, and on the top surface of the second fin mesa and the second undercut spacer.

16. The vertical fin field effect device of claim 15, further comprising a first bottom source/drain region in the first fin mesa below the first vertical fin, and a second bottom source/drain region in the second fin mesa below the second vertical fin.

17. The vertical fin field effect device of claim 16, wherein the first undercut spacer and the second undercut spacer each have a thickness in a range of about 3 nm to about 15 nm.

18. The vertical fin field effect device of claim 17, wherein the first vertical fin is separated from the second vertical fin by a fin pitch in a range of about 30 nm to about 100 nm.

* * * * *